United States Patent
Basker et al.

(10) Patent No.: US 9,484,264 B1
(45) Date of Patent: Nov. 1, 2016

(54) FIELD EFFECT TRANSISTOR CONTACTS

(71) Applicant: International Business Machines Corporation, Armonk, NY (US)

(72) Inventors: Veeraraghavan S. Basker, Schenectady, NY (US); Kangguo Cheng, Schenectady, NY (US); Theodorus E. Standaert, Clifton Park, NY (US); Junli Wang, Singerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/812,330

(22) Filed: Jul. 29, 2015

(51) Int. Cl.
*H01L 27/08* (2006.01)
*H01L 29/06* (2006.01)
*H01L 29/49* (2006.01)
*H01L 21/8234* (2006.01)
*H01L 27/088* (2006.01)
*H01L 21/768* (2006.01)
*H01L 21/311* (2006.01)

(52) U.S. Cl.
CPC . *H01L 21/823475* (2013.01); *H01L 21/31144* (2013.01); *H01L 21/7684* (2013.01); *H01L 21/823431* (2013.01); *H01L 21/823437* (2013.01); *H01L 27/0886* (2013.01); *H01L 29/0642* (2013.01); *H01L 29/495* (2013.01); *H01L 29/4966* (2013.01)

(58) Field of Classification Search
CPC ........... H01L 27/0886; H01L 29/0642; H01L 29/495; H01L 49/4966
See application file for complete search history.

(56) References Cited

U.S. PATENT DOCUMENTS

| | | | |
|---|---|---|---|
| 6,465,310 B2 | 10/2002 | Lee et al. | |
| 7,547,947 B2 * | 6/2009 | Anderson | H01L 27/11 257/369 |
| 8,293,616 B2 * | 10/2012 | Chang | H01L 21/82387 257/E21.564 |
| 8,298,913 B2 * | 10/2012 | Anderson | H01L 21/28123 257/E21.159 |
| 8,440,533 B2 | 5/2013 | Toh et al. | |
| 8,604,562 B2 * | 12/2013 | Wang | H01L 21/31055 257/288 |
| 8,637,359 B2 | 1/2014 | Chang et al. | |
| 8,686,514 B2 * | 4/2014 | Guo | H01L 21/845 257/392 |
| 8,815,659 B2 * | 8/2014 | Chi | H01L 27/0886 257/E21.637 |
| 8,878,311 B2 | 11/2014 | Cheng et al. | |
| 8,927,378 B2 | 1/2015 | Pei et al. | |
| 8,963,257 B2 * | 2/2015 | Wann | H01L 29/66818 257/401 |
| 8,975,712 B2 | 3/2015 | Rashed et al. | |
| 8,999,779 B2 | 4/2015 | Naczas et al. | |

(Continued)

OTHER PUBLICATIONS

IBM; "Trench Silicide Contacts"; IP.com; IP.com No. 000184729; p. 1-2; Jul. 1, 2009.

*Primary Examiner* — Ida M Soward
(74) *Attorney, Agent, or Firm* — Cantor Colburn LLP; Vazken Alexanian (57) ABSTRACT

A first field effect transistor (FET) device includes a first gate over a first channel region of a first fin arranged on a substrate, a second gate of a second FET device over a second channel region of a second fin arranged on the substrate, the second channel region having a width that is greater than a width of the first channel region, a first cavity that exposes an active region of the first FET device and a second cavity that exposes an active region of the second FET device, and a conductive material in the first cavity to define a first contact and a conductive material in the second cavity to define a second contact, the second contact having a width that is greater than a width of the first contact.

6 Claims, 8 Drawing Sheets

(56) References Cited

U.S. PATENT DOCUMENTS

| | | | | |
|---|---|---|---|---|
| 9,029,263 B1* | 5/2015 | Kim | | H01L 21/82343 257/E21.038 |
| 9,041,107 B2* | 5/2015 | Anderson | | H01L 21/76283 257/347 |
| 9,287,129 B2* | 3/2016 | Lin | | H01L 27/0924 |
| 9,299,842 B2* | 3/2016 | Baek | | H01L 29/785 |
| 2007/0114612 A1* | 5/2007 | Ahn | | H01L 27/11 257/364 |
| 2007/0141798 A1 | 6/2007 | Bohr | | |
| 2007/0284669 A1* | 12/2007 | Abadeer | | B07C 5/344 257/368 |
| 2008/0093674 A1* | 4/2008 | Lee | | H01L 29/66795 257/365 |
| 2012/0273895 A1* | 11/2012 | Anderson | | H01L 29/785 257/369 |
| 2013/0187171 A1 | 7/2013 | Guillorn et al. | | |
| 2015/0228722 A1* | 8/2015 | Chung | | H01L 29/0657 257/401 |
| 2015/0294913 A1* | 10/2015 | Leobandung | | H01L 21/82343 438/275 |
| 2016/0093620 A1* | 3/2016 | Kim | | H01L 27/0924 257/369 |
| 2016/0104704 A1* | 4/2016 | Fang | | H01L 27/0886 257/392 |
| 2016/0148998 A1* | 5/2016 | Wu | | H01L 29/0649 257/369 |
| 2016/0163706 A1* | 6/2016 | Kim | | H01L 27/0924 257/369 |

* cited by examiner

FIELD EFFECT TRANSISTOR CONTACTS

BACKGROUND

The present invention relates to field effect transistor (FET) devices, and more specifically, to contacts for FET devices.

Field effect transistor devices include a gate stack arranged over a channel region and source and drain active regions adjacent to the gate stack. The source and drain regions are often covered with conductive contacts that include metallic or silicide material.

FinFET devices are multi-gate FET devices that include a semiconductor fin arranged on a substrate. The fin provides a channel region with three surfaces with a gate stack patterned on the channel region. Active source and drain regions are arranged on the fin adjacent to the gate stack. FinFET devices improve FET performance while reducing the size of the FET devices.

Previous finFET fabrication processes included patterning a fin from a semiconductor material using a lithographic patterning and etching process such as reactive ion etching. Often a dummy gate stack is patterned on the fins to define a channel region on the fin. Subsequently, active regions are formed on the fin by implanting dopants or epitaxially growing semiconductor material on exposed portions of the fin. Following the formation of the active regions, the dummy gate stack may be removed and replaced with a gate stack that is formed over the channel region of the fins.

Often an insulator such as an oxide material is grown over the active regions. The insulator is patterned and etched using a photolithographic etching process that removes portions of the insulator material to expose the active regions of the FET devices. A conductive material is deposited on the active regions and a planarization process is performed to remove overburdened conductive material. Properly aligning the photolithographic mask used in removing the insulator material can be problematic, thus it is desirable to form FET devices with a process with a minimal number of photolithographic masks.

SUMMARY

According to one embodiment of the present invention, a method for forming a field effect transistor device comprises forming a first gate stack of a first field effect transistor (FET) device over a first channel region of a first fin arranged on a substrate, forming a second gate stack of a second FET device over a second channel region of a second fin arranged on the substrate, the second channel region having a width that is greater than a width of the first channel region, patterning a masking layer over portions of an insulator material, the insulator material arranged over portions of the first fin, the second fin, and the substrate, etching to remove exposed portions of the insulator material and define a first cavity that exposes an active region of the first FET device and a second cavity that exposes an active region of the second FET device, and depositing a conductive material in the first cavity to define a first contact and depositing a conductive material in the second cavity to define a second contact, the second contact having a width that is greater than a width of the first contact.

According to another embodiment of the present invention, method for forming a field effect transistor (FET) device comprises forming a first gate stack of a first field effect transistor device over a first channel region of a fin arranged on a substrate, forming an insulator material layer over exposed portions of the fin and the substrate, forming a second gate stack of a second FET device over a second channel region of the fin arranged on the substrate, the second channel region having a width that is greater than a width of the first channel region, patterning a masking layer over portions of the insulator material layer, etching to remove exposed portions of the insulator material layer to define a first cavity that exposes an active region of the first FET device and a second cavity that exposes an active region of the second FET device, and depositing a conductive material in the first cavity to define a first contact and depositing a conductive material in the second cavity to define a second contact, the second contact having a width that is greater than a width of the first contact.

According to yet another embodiment of the present invention, a field effect transistor device comprises a first fin arranged on a substrate, a second fin arranged on the substrate, a first gate stack arranged on the first fin, a second gate stack arranged on the second fin, the first gate stack having a width that is greater than a width of the second gate stack, a first conductive contact electrically communicative with an active region of the first fin, and a second conductive contact electrically communicative with an active region of the second fin, the first conductive contact having a width that is greater than a width of the second conductive contact.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

It is desirable to fabricate field effect transistor devices (FETs) having conductive contacts with different widths to efficiently operate at different voltages. When fabricating such FETs it is desirable to minimize the number of photolithographic masks used in forming the conductive contacts.

Figure 1:
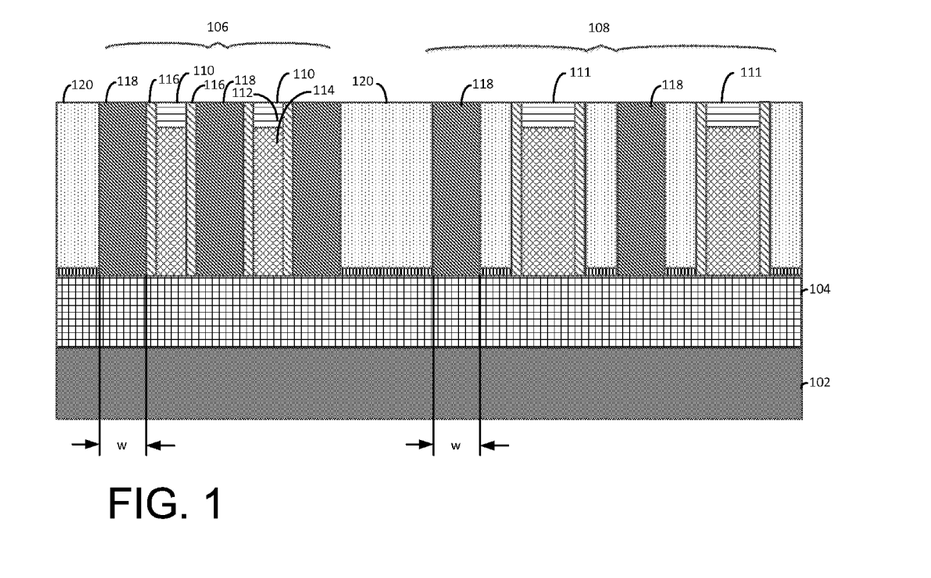
FIG. 1 illustrates an example of an arrangement of field effect transistor devices (FETs).

FIG. 1 illustrates an example of an arrangement of FETs. The FETs 106 are high performance, low voltage FETs having a gate stack 110 that is arranged over semiconductor fins 104 and a substrate 102. The gate stack 110 includes a metal gate material 114 and a cap layer 112 that may include, for example, a nitride or silicon nitride material. Spacers 116 are arranged adjacent to the gate stacks 110. Contacts 118 are arranged over the active regions of the FETs 106. The contacts 118 have a width w. An insulator material such as, for example, an oxide material 120 is arranged on the fin 104 and the substrate 102.

The FETs 108 of FIG. 1 are higher voltage FETs that may be used, e.g., for input and output circuits. The FETs 108 include gate stacks 111. The process for patterning the contacts 118 uses a single mask for patterning the contacts 118 for the FETs 106 and the FETs 108, and the width of the contacts 118 for the FETs 108 is the same width, w, as the contacts 118 for the FETs 106.

Since the FETs 108 operate at a higher voltage, the contacts 118 for the FETs 108 are too narrow and result in an undesirably high external resistance for the FETs 108.

The methods and resultant structures described below provide contacts having different widths using a single mask to pattern the contacts.

Figure 2:
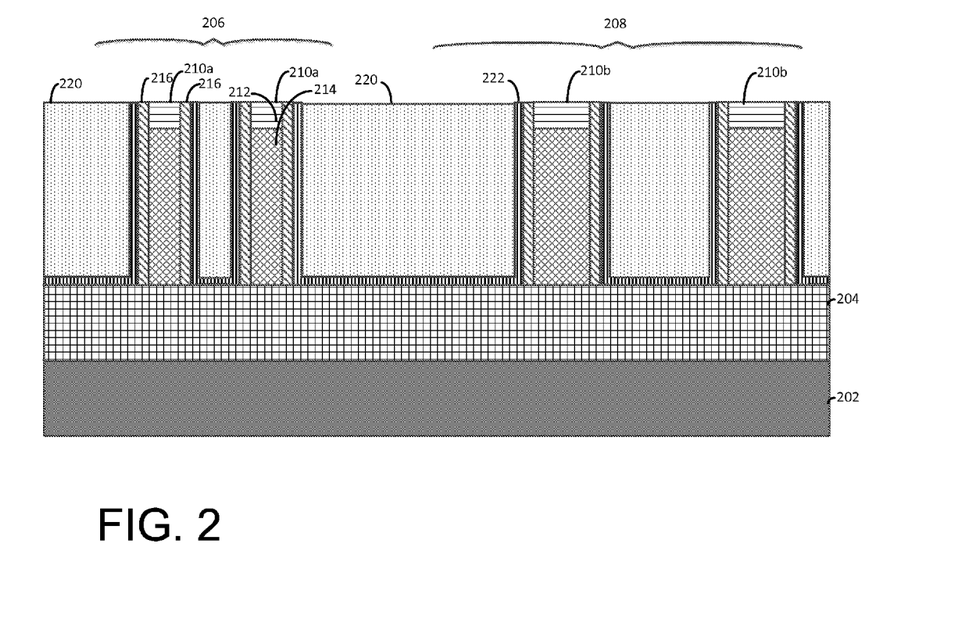
FIG. 2 illustrates an exemplary method for fabricating FET devices.

FIG. 2 illustrates an exemplary method for fabricating FET devices. In the illustrated example FIG. 2 shows a side view of a fin 204 has been formed on a substrate 202. The substrate 202 may include, for example a silicon-on-insulator (SOI) substrate, or a semiconductor material substrate. The fin 204 may be formed by a lithographic patterning and etching process such as, for example, reactive ion etching (RIE). Following the formation of the fin, gate stacks 210 are formed. In the illustrated embodiment, the gate stacks 210 include a metallic gate metal portion 214 and a cap layer portion 212. The metallic gate metal portion may include, for example, tantalum, tantalum nitride, niobium, or tungsten materials. The cap layer portion 212 may include, for example, an oxide or silicon material. Spacers 216 are arranged adjacent to the gate stacks 210. The spacers 216 may be formed from, for example, a nitride or oxide material. A liner layer 222 is disposed on the fin 204 and the substrate 202. The liner layer 222 may include, for example, a nitride material. An insulator layer 220 that may include, for example, an oxide material is disposed on the liner layer 222.

In the illustrated embodiment, FET devices 206 are high performance, low voltage devices that include the gate stacks 210a. The FET devices 208 are high voltage FET devices that include the gate stacks 210b. It is desirable for the FET devices 208 to have relatively larger contacts (to be described below) than the contacts for the FET devices 206 to reduce the external resistance of the FET devices 208.

Figure 3:
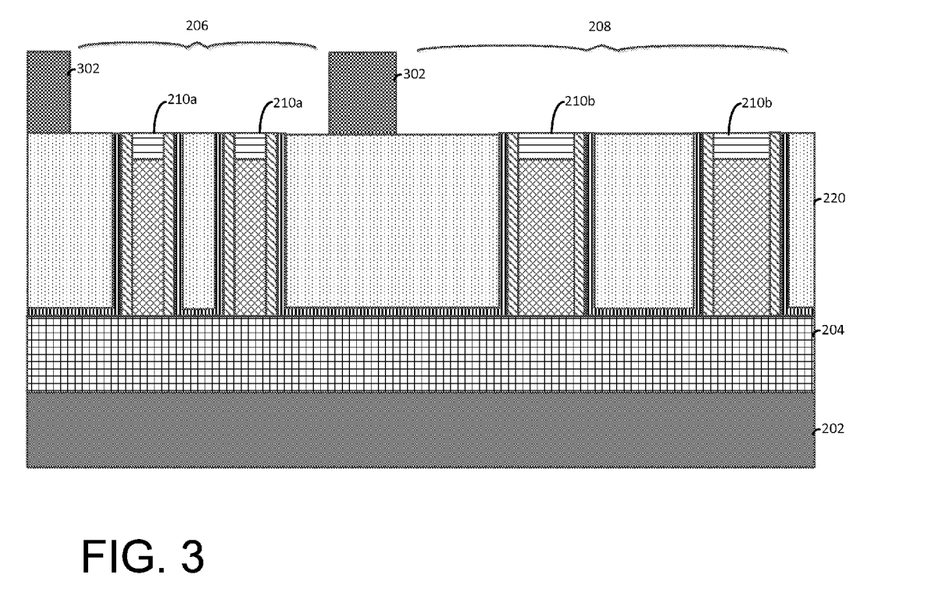
FIG. 3 illustrates the formation of a mask.

FIG. 3 illustrates the formation of a mask 302 over portions of the insulator layer 220. The mask 302 may be formed by, for example, a photolithographic process. The mask 302 may include, for example, an organic material.

Figure 4:
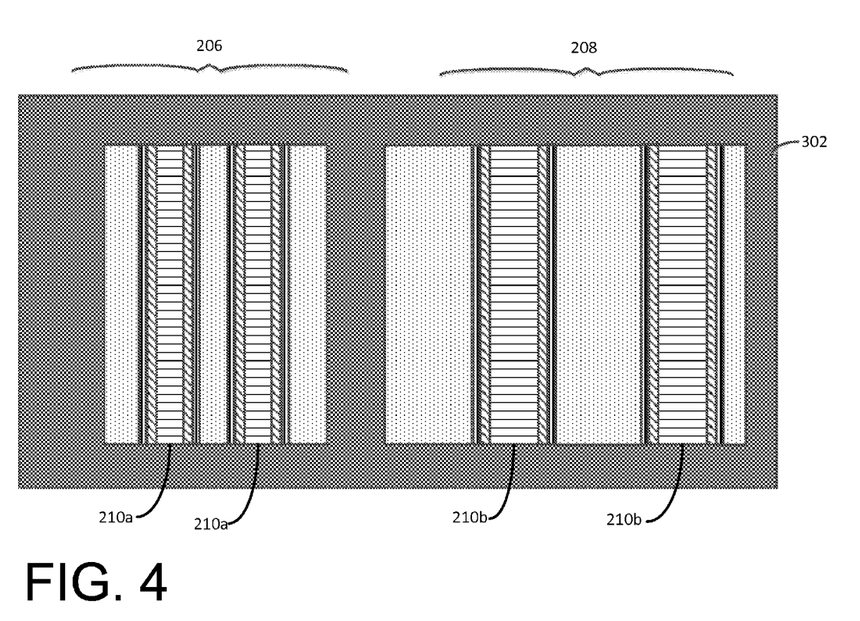
FIG. 4 illustrates a top view of the mask.

FIG. 4 illustrates a top view of the mask 302 arranged over portions of the insulator layer 220.

Figure 5:
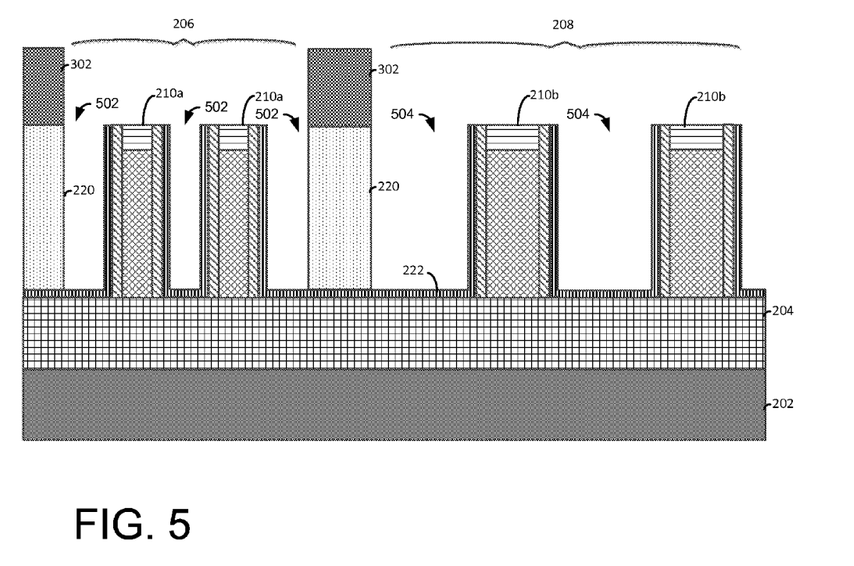
FIG. 5 illustrates a side view of the resultant structure following an etching process.

FIG. 5 illustrates a side view of the resultant structure following an etching process such as, for example, a reactive ion etching (RIE) process that removes exposed portions of the insulator layer 220. The etching process is selective to the gate cap material on the gate stacks 210 and the spacers adjacent to the gate stacks 210 and results in cavities 502 and 504 adjacent to the gate stacks 210a and 210b respectively. The gate stack 210 cap layer and spacer materials may include, for example, a SiN or low k materials such as SiBCN, SiOCN, or SiOC.

Figure 6:
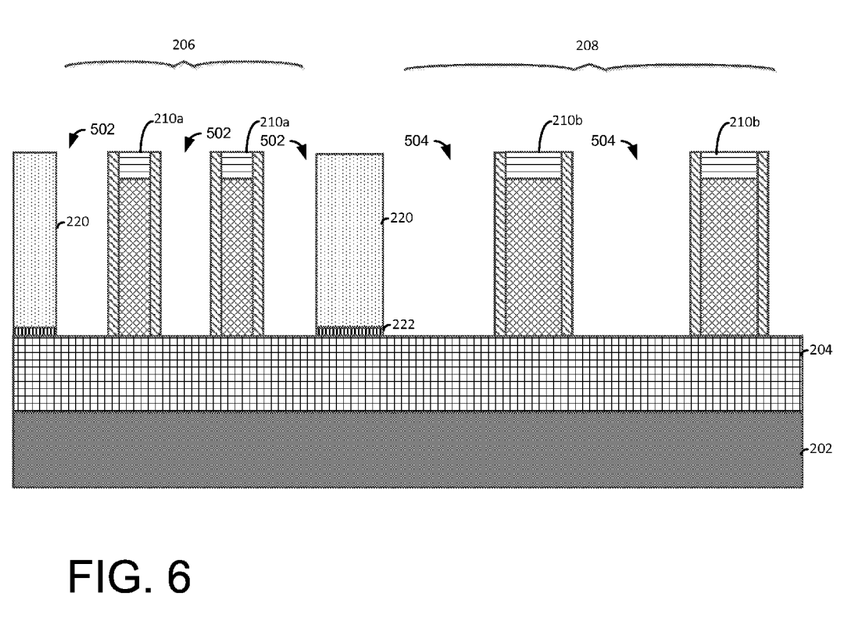
FIG. 6 illustrates the resultant structure after the mask is removed.

FIG. 6 illustrates the resultant structure after the mask 302 (of FIG. 5) is removed using a suitable process such as, for example an oxygen plasma ashing process.

In the illustrated exemplary methods, exposed portions of the liner layer 222 in the cavities 502 and 504 may be removed by a suitable etching process such as, for example a RIE process that is selective to the spacer materials. The exposed portions of the liner layer 222 may be removed after the insulator layer 220 is etched, but before the mask 302 is removed. Alternatively, the liner layer 222 may be removed when the mask 302 is removed or after the mask 302 is removed.

Figure 7:
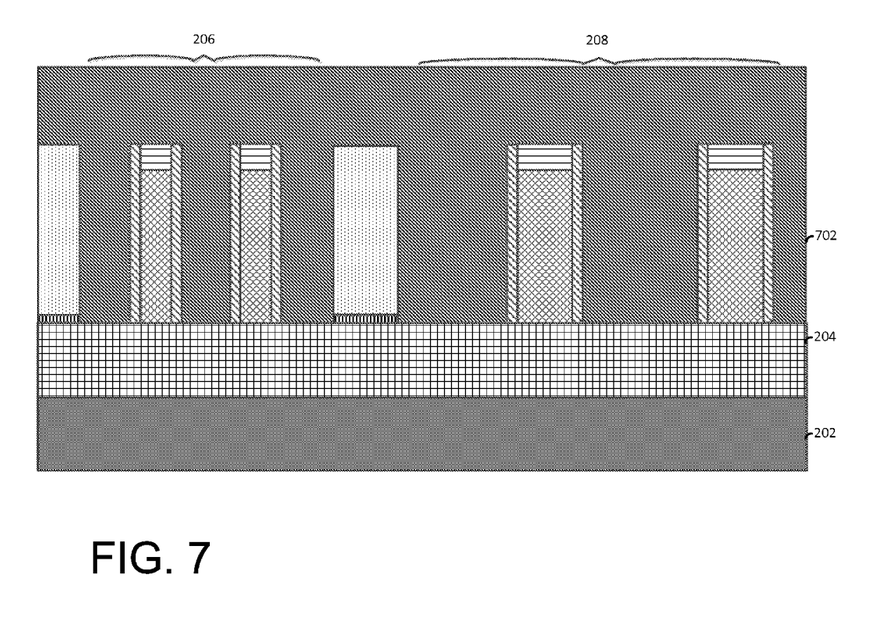
FIG. 7 illustrates the deposition of a conductive material.

FIG. 7 illustrates the deposition of a conductive material 702. The conductive material 702 may include, for example, a metal material such as, for example, aluminum, copper, or silver or in some alternate embodiments, a conductive silicide material.

Figure 8:
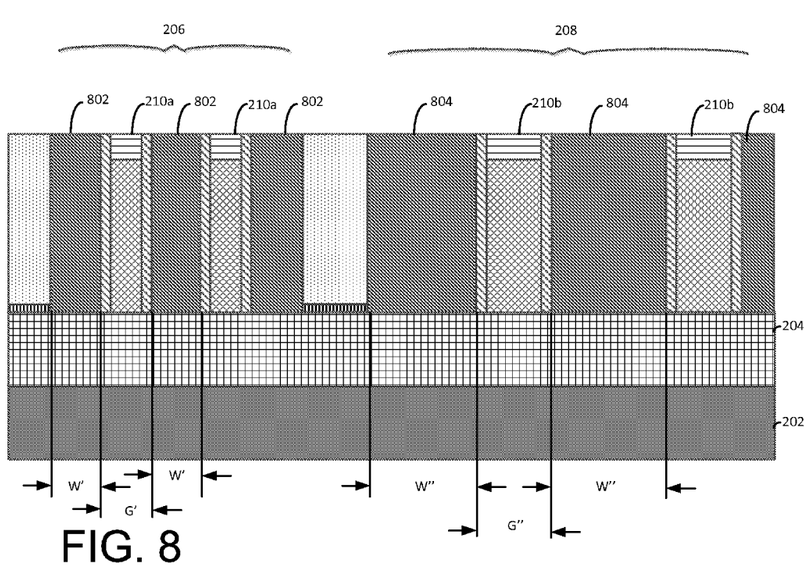
FIG. 8 illustrates the resultant structure following a planarization process.

FIG. 8 illustrates the resultant structure following a planarization process such as, for example, a chemical mechanical polishing (CMP) process that removes portions of the conductive material to define contacts 802 and 804 adjacent to the gates 210a and 210b. The contacts 802 of the FET devices 206 have a width w' while the contacts 804 of the FET devices 208 have a width w". The width w' is less than the width w". The gate stacks 210a have a width G' and the gate stacks 210b have a width G" where the width G' is less than the width G".

The embodiments described herein provide devices with a reduced aspect ratio and contacts that reduce external resistance in the devices. The contacts remain arranged in the RX region (active region) of the device and do not extend beyond the edges of the RX region.

The methods and structures described herein provide for contacts having different widths being formed using a single mask in a self-aligned patterning and etching process.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A field effect transistor device comprising:
   a first fin arranged on a substrate;
   a second fin arranged on the substrate;
   a first gate stack arranged on the first fin;
   a second gate stack arranged on the second fin, the first gate stack having a width that is greater than a width of the second gate stack;
   a first conductive contact electrically communicative with an active region of the first fin; and
   a second conductive contact electrically communicative with an active region of the second fin, the first conductive contact having a width that is greater than a width of the second conductive contact.

2. The device of claim 1, further comprising an insulator layer arranged between the first conductive contact and the second conductive contact.

3. The device of claim 1, wherein the first fin includes a semiconductor material.

4. The device of claim 1, wherein the first conductive contact includes a metallic material.

5. The device of claim 1, wherein the substrate includes an insulator material.

6. The device of claim 1, wherein the gate stack includes a metallic gate material.

* * * * *